United States Patent
Bueb et al.

(10) Patent No.: US 8,572,466 B2
(45) Date of Patent: Oct. 29, 2013

(54) APPARATUSES, SYSTEMS, DEVICES, AND METHODS OF REPLACING AT LEAST PARTIALLY NON-FUNCTIONAL PORTIONS OF MEMORY

(75) Inventors: Chris Bueb, Folsom, CA (US); Sean Eilert, Penryn, CA (US)

(73) Assignee: Micron Technology, Inc., Boise, ID (US)

(*) Notice: Subject to any disclaimer, the term of this patent is extended or adjusted under 35 U.S.C. 154(b) by 219 days.

(21) Appl. No.: 13/154,358

(22) Filed: Jun. 6, 2011

(65) Prior Publication Data

US 2012/0311393 A1  Dec. 6, 2012

(51) Int. Cl.
*G11C 29/00* (2006.01)
*H03M 13/00* (2006.01)

(52) U.S. Cl.
USPC .......................................... 714/774; 714/764

(58) Field of Classification Search
None
See application file for complete search history.

(56) References Cited

U.S. PATENT DOCUMENTS

| | | | |
|---|---|---|---|
| 6,961,890 B2* | 11/2005 | Smith | 714/763 |
| 8,151,163 B2* | 4/2012 | Shalvi et al. | 714/758 |
| 2003/0037299 A1* | 2/2003 | Smith | 714/763 |
| 2008/0016392 A1 | 1/2008 | Earl et al. | |
| 2008/0072120 A1* | 3/2008 | Radke | 714/768 |
| 2009/0287956 A1 | 11/2009 | Flynn et al. | |
| 2010/0017650 A1 | 1/2010 | Chin et al. | |
| 2010/0115376 A1* | 5/2010 | Shalvi et al. | 714/763 |
| 2010/0281202 A1* | 11/2010 | Abali et al. | 711/103 |
| 2012/0159281 A1* | 6/2012 | Shalvi et al. | 714/755 |
| 2012/0260148 A1* | 10/2012 | Hughes et al. | 714/773 |
| 2012/0297258 A1* | 11/2012 | Flynn et al. | 714/710 |

FOREIGN PATENT DOCUMENTS

EP  1293978 A1  3/2003

* cited by examiner

*Primary Examiner* — Guerrier Merant
(74) *Attorney, Agent, or Firm* — Knobbe Martens Olson & Bear LLP

(57) ABSTRACT

Subject matter disclosed herein relates to determining that a portion of a memory is at least partially non-functional, replacing the portion of at least partially non-functional memory; and adjusting an error detection and/or correction process responsive to determining that the portion of the memory is at least partially non-functional and/or replacing the portion of at least partially non-functional memory.

26 Claims, 4 Drawing Sheets

APPARATUSES, SYSTEMS, DEVICES, AND METHODS OF REPLACING AT LEAST PARTIALLY NON-FUNCTIONAL PORTIONS OF MEMORY

BACKGROUND

1. Field

Subject matter disclosed herein relates to memory, and, more particularly, to error detection and/or correction for memory.

2. Information

Memory devices may be used in various electronic devices, such as computers, cell phones, personal digital assistants (PDA's), data loggers, or navigational equipment, just to name a few examples. For example, various types of nonvolatile memory devices may be used, such as solid state drives (SSD), NAND or NOR flash memory, or phase change memory (PCM), among others. A write or read operation may involve one or more processes to detect and/or correct errors in signal or state information written to or read from memory.

Nonvolatile memory devices may comprise memory cells that may slowly deteriorate over time, leading to an increasing probability that a read or write error may occur as a result of accessing a memory cell. Errors may also result from manufacture defects or marginal memory device construction, just to name a few examples. Accordingly, an error detection and/or correction process may be used to detect and/or correct such errors as they occur. For example, various error codes (EC) may be used (e.g., applied) to detect and/or correct errors. Some error codes relate to error detection while others relate to error correction.

BRIEF DESCRIPTION OF THE FIGURES

Non-limiting and non-exhaustive embodiments will be described with reference to the following figures, wherein like reference numerals refer to like parts throughout various figures unless otherwise specified.

DETAILED DESCRIPTION

Figure 1:
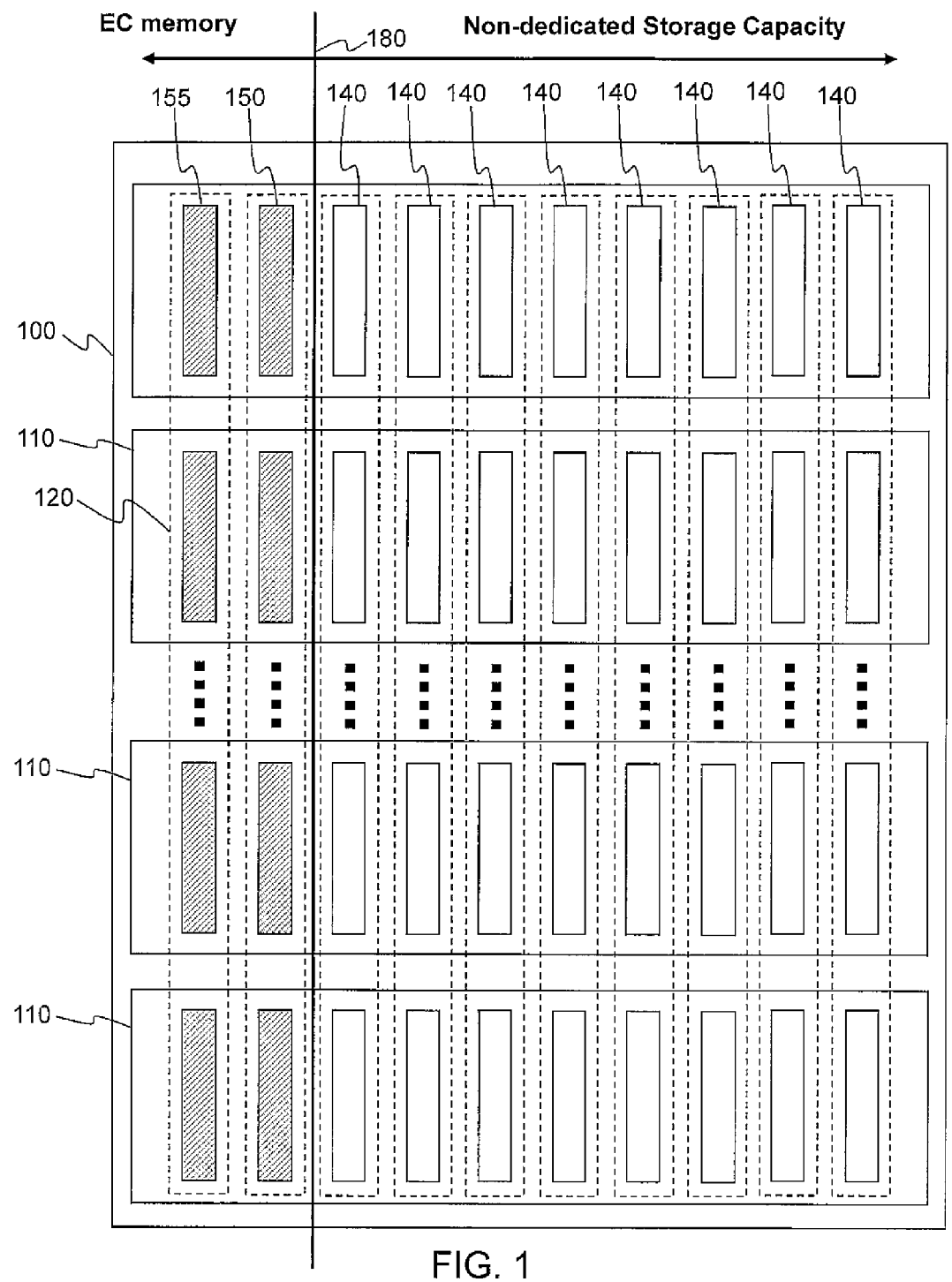
FIG. 1 is a schematic diagram of a portion of an embodiment of memory.

Reference throughout this specification to "one embodiment" or "an embodiment" means that a particular feature, structure, or characteristic described in connection with an embodiment is included in at least one embodiment of claimed subject matter. Thus, appearances of phrases such as "in one embodiment" or "an embodiment" in various places throughout this specification are not necessarily all referring to the same embodiment. Furthermore, particular features, structures, or characteristics may be combined in one or more embodiments.

Embodiments described herein may include methods or electronic architecture involving application of one or more error codes (EC) to a memory device or memory system. In accordance with context, EC may be used to refer to an error code or to more than one error code. It is noted that error codes may relate to detection or to detection and correction. Likewise, some error codes may be more robust than others in terms of desirable attributes. For example, some error codes may provide a more precise error location than others. Likewise, some error codes may permit error correction (e.g., provide the ability to reconstruct signal or state information intended to be stored). Typically, a more robust error code employs more bits.

A memory typically may be non-transitory or comprise a non-transitory device. In this context, a non-transitory memory may include a device that is tangible, meaning that the device has a concrete physical form, although the device, or portions thereof, may change physical state. Non-transitory refers to a device, or a portion thereof, remaining tangible despite a change in state. Nonetheless, a particular state of a memory location may be sensed and may result in an analog or digital signal representing the sensed state. A binary zero or binary one memory state, for example, may be sensed and result in a binary zero digital signal or a binary one digital signal, which may then be processed or transmitted, for example. Similarly, a multi-level memory state, for example, may be sensed and result in a combination of a binary zero digital signal and/or a binary one digital signal, which may then be processed or transmitted, for example. The terms "state" and "signal" refer to a physical realization or manifestation. As a result, these terms may at times be used interchangeably without loss of meaning or understanding.

A method of operating a memory system may include replacing an at least partially non-functional portion of memory with a portion of "EC memory" so that the memory system may continue to operate without loss of memory capacity. In this context, the terms "EC memory," "EC-parity memory," "EC-related memory" or similar terminology are intended to refer to a portion of memory allocated to storing one or more error codes (EC). As explained below, substituting a portion of EC memory to replace an at least partially-functional memory may result in a reduced ability to detect and/or correct errors. Accordingly, error detection and/or correction processes (e.g., techniques) may be adjusted, such as to account for a less robust EC, for example.

A memory device may comprise memory cells that slowly deteriorate over time, which may lead to an increased probability that one or more errors may occur while writing to or reading from the memory device. A memory device may also comprise defective or marginally functional memory cells as a result of manufacture, for example. Errors may be detected and/or corrected using EC or other approaches. From a system perspective, a determination may be made as to whether or not to continue to utilize error-prone memory locations (e.g., memory cells) that may be identified. A determination may be based, at least in part, on a comparison of a number of occurring errors to an error threshold, which may be defined during a design stage of a memory device or during manufacture, for example. In one implementation, use of particular memory locations (e.g., memory cells) may be discontinued before the memory locations produce an excess number of errors. Discontinuing use of memory locations may be expressed as "retiring" those memory locations. Observing a number of errors approaching an error threshold may be a way to predict that particular memory locations may soon or eventually produce too many errors, so use may be stopped before the memory locations reach that condition, for example. In another implementation, a portion of memory may produce a number of errors that have already increased beyond an error threshold. It is desirable to address portions of a memory that produce a relatively high number (e.g., too high for EC processes to detect or correct) of errors. For instance, spare locations of a memory may replace identified error-prone memory locations in a manner that maintains a desired overall memory capacity. In at least one embodiment, "spare" locations of memory may comprise locations formerly allocated to error code storage, or to storage of related or other memory management-related signal or state information, for example. Thus, spare locations of memory may have previously been allocated (e.g., used or dedicated) to storage of signal or state information other than error codes.

A method of retiring a portion of a memory system may include transferring (e.g., moving, copying, etc.) signal or state information stored in a to-be-retired portion of a memory to another portion of memory. Signal or state information stored in a retired portion of memory may be transferred to an EC memory portion, for example. For example, an EC portion of memory may include a physical location of memory not initially recognized or considered as part of available capacity in terms of memory locations available for signal or state information storage. A method of retiring a portion of memory may also include remapping signal or state information stored at a memory location in a to-be-retired portion to another memory location in another portion of memory other than the to-be-retired portion. Of course, such methods are merely examples, and claimed subject matter is not so limited.

Embodiments, such as those described above, may allow satisfactory use of storage devices involving relatively less reliable technologies. For example, a chip or die previously considered or viewed unusable as a result of identifying error-prone memory locations may be used in solid state drives (SSD) using embodiments described herein. Also, performing methods described herein may extend a usable or useful lifetime of a storage device. For example, memory locations may be replaced, whereas if that did not occur a device might otherwise fail or be unusable.

As described in detail below, a memory die may comprise a discrete semiconductor chip that may comprise a portion of individual memory partitions that collectively make up a larger memory, such as an SSD, for example. Error detection and/or correction may be available for individual memory die, partitions, or sectors in a memory. For example, a memory may store EC for error detection and/or correction of signals or states stored across multiple memory die of a memory.

In one embodiment, a method of operating a device may include adaptively adjusting (e.g., reducing) error detection and/or correction for a memory to extend the usable or useful life of the device that comprises the memory. An adjustment may be performed, for example, if a portion of the memory is determined to be at least partially non-functional. The term "error detection" or "error detectability" refers to an extent to which read or write errors may be detected. For example, some EC process (e.g., technique) may detect errors more precisely than others, such as by using codes having more bits. The terms "partially non-functional", "non-functional", or "non-functioning" as applied to one or more memory locations refers to the one or more locations that may produce or having been determined to have or to produce a relatively or unacceptably high probability of introducing errors to state information written to or read from the one or more memory locations. The term "partially non-functional" may also refer to marginally functional memory cells and/or portions of memory that may produce or have been determined to have or to produce an excess number of errors, for example. Non-functional memory includes memory that is at least partially non-functional and may also be called "bad memory." Non-functional memory may result from a number of things, such as defective manufacture, aging, or damaged memory locations, just to name a few examples.

If a portion of EC memory is used to replace (e.g., substitute for) a portion of bad memory, the size or length of stored EC, in effect, becomes smaller. As a result, error detection and/or error correction with the smaller codes may be less robust than error correction and/or detection using codes that have not become smaller. Effectively the level of error detection and/or correction for memory locations associated with the smaller EC has been adaptively reduced. In an embodiment, for example, in real-time, a bad portion of memory may be identified. After identification, replacement of the bad portion of memory with a portion of EC memory results in an adaptive adjustment (e.g., modification) of the level of error detection and/or correction Replacement of memory locations with other memory locations may involve adjusting (e.g., modifying) a memory map to replace a non-functional portion of memory with a portion of EC memory, for example. As mentioned above, EC memory may comprise a memory portion not initially allocated (e.g., recognized or considered) as part of available memory storage capacity. EC memory may comprise a memory portion initially allocated to store codes or other memory management related signal or state information useful for detecting and/or correcting errors that may have occurred.

A method to determine that a portion of a memory is at least partially non-functional may comprise comparing signal or state information read from memory without applying EC with signal or state information read from memory with applying EC. In detail, a particular portion of memory may be read without using (e.g., applying, employing, etc.) any error detection and/or correction. The particular portion of memory may also be read using EC to perform error detection and/or correction. Various orders are possible to apply these operations and claimed subject matter is not limited in scope to any particular order. For a particular memory location, a difference between signal or state information read without performing error detection and/or correction and signal or state information read using error detection and/or correction may indicate that the particular memory location, for example, is at least partially non-functional.

Methods to adaptively adjust error detection and/or correction may be performed using a non-volatile memory device comprising a plurality of integrated circuit (IC) memory chips. In at least one implementation, some IC memory chips (or portions thereof) may comprise memory to store any desired type of signal or state information while other IC memory chips (or portions thereof) may comprise EC memory to store EC signal or state information to be used in performing error detection and/or correction. Likewise, of course, a single chip may be used to store EC and other signal or state information.

Continuing with the example above, nonetheless, a particular memory partition may include particular memory sectors. A non-volatile memory device may also comprise a memory controller.

A memory controller may be able to identify an at least partially non-functional memory sector, for example, by determining a difference between signal or state information read from a memory sector using error detection and/or correction and signal or state information read without using error detection and/or correction, as mentioned above. Likewise, a memory controller may adaptively reduce the level of error detection and/or correction used so that a section of EC memory may be used to replace the identified non-functional sector.

FIG. 1 is a schematic diagram of a portion 100 of a memory. For example, particular to portion 100, partitions 110 (of which four are explicitly shown) may individually include eight memory sectors 140 of available storage capacity and two memory sectors, 150 and 155, of EC storage. Particular numbers of partitions or sectors are described for sake of convenience and to simplify explanation and understanding. It is to be understood, however, that embodiments are not limited to any particular number of partitions or sectors, for example, and claimed subject matter is not so limited.

Memory sectors 150 and 155 (in FIG. 1 left of line 180) may comprise EC memory to store EC signal or state information. Memory sectors 140 (right of line 180) may comprise available storage capacity to store code or application-related signal or state information, for example. Memory portion 100 may span across ten memory devices 120. Memory sectors, such as 140, 150 or 155, may individually comprise an array of memory locations (e.g., cells). For example, an array may have a size of 16, 128, 256, or 512 kilobytes. Different sectors of a memory device 120, however, may be included within different partitions 110. Of course, claimed subject matter is not limited to any particular size of array or partition.

As discussed in further detail below, memory sectors 150 or 155 may be used to store EC-related signal or state information for detecting and/or correcting errors associated with memory sectors 140 within a particular partition. In one implementation, memory device 120 may comprise an individual memory chip or die that includes memory sectors, row or column decoders, one or more sense amplifiers, or other circuitry involved in read or write operations, for example. One or more portions of memory device 120 may include memory locations capable of storing, for example, a digital state representative of digital signal information, such as a binary state "0" or binary state "1." For example, a memory state representative of signal information may be "stored" in a portion of memory device 120 by changing (e.g., affecting) a state of a memory location. A change of state of a memory location may constitute a transformation to a different state or thing. Of course, details of a portion of memory are merely examples, and claimed subject matter is not so limited.

Figure 2:
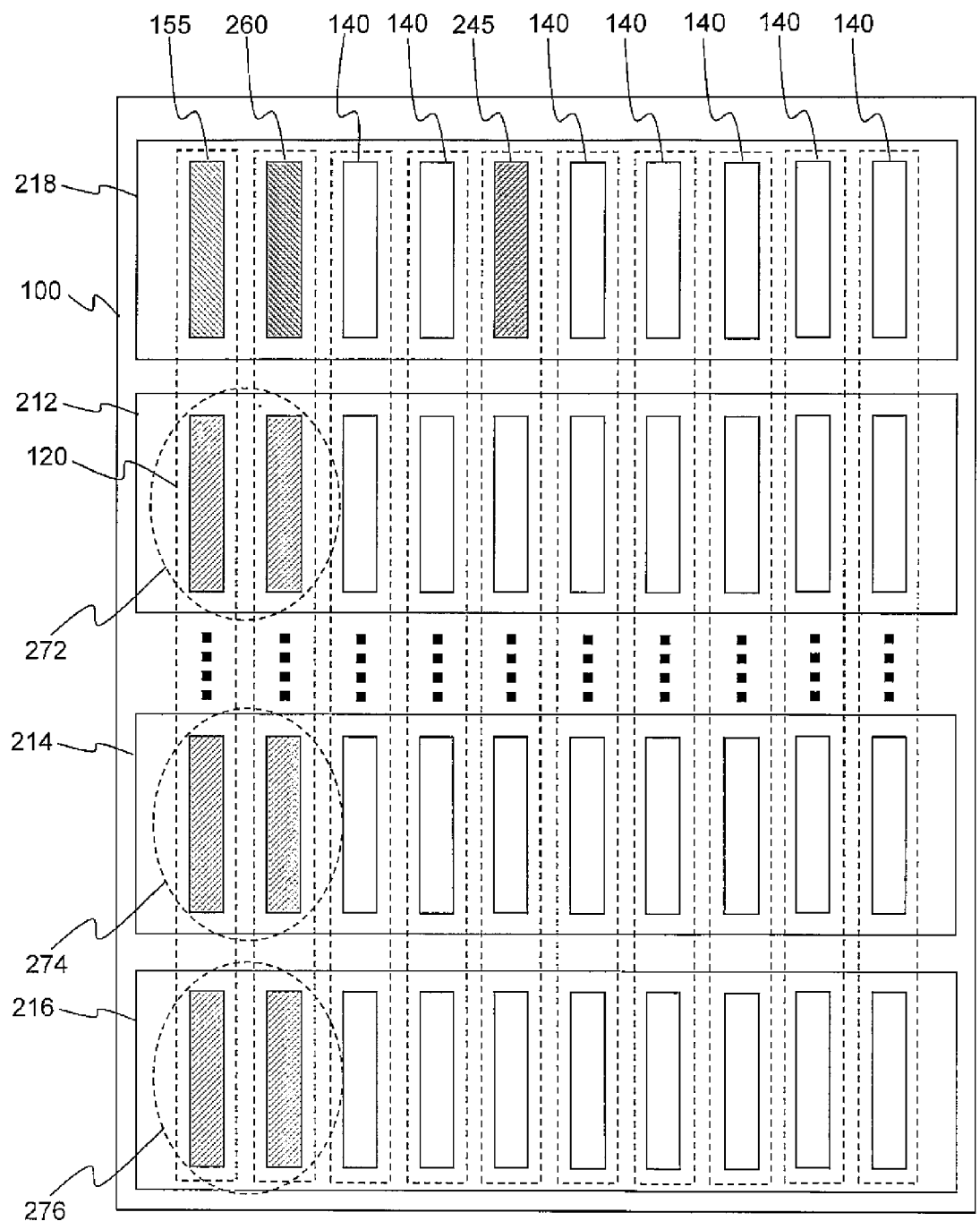
FIG. 2 is a schematic diagram of a portion of another embodiment of memory.

FIG. 2 is a schematic diagram of portion 100 including a bad portion 245. As discussed above, any one or more of memory sectors 140, for example, may produce read or write errors. If a memory sector includes a threshold number of error prone memory locations, for example, that memory sector may be determined to be non-functional and retired. A sector of EC memory may be used as a replacement for the memory sector to be retired. In FIG. 2, for example, sector 260 may replace sector 245. For example, a memory map used by a controller may be adjusted (e.g., updated) to redirect read or write operations from sector 245 to sector 260. Signal or state information formerly stored in sector 245 may also be transferred (e.g., copied) to sector 260 in place of EC previously stored.

As mentioned above, sectors 150 or 155 may be used to store EC-related signal or state information for detecting and/or correcting errors associated with memory sectors 140 within a particular partition. For example, sectors 272 may be used to store EC-related signal or state information associated with sectors 140 in partition 212, sectors 274 may be used to store EC-related signal or state information associated with sectors 140 in partition 214, sectors 276 may be used to store EC-related information associated with sectors 140 in partition 216, and so on. In some embodiments, for example, there may be two EC sectors for an individual partition, although claimed subject matter is not limited to any particular number. On the other hand, subsequent to substituting for sector 245, sector 260 may no longer be available to serve as EC memory for partition 218. However, sector 155 of partition 218 may be left available for error detection and/or correction operations. Nonetheless, error detection and/or correction for partition 218 may be adjusted (e.g., changed) as a result. For example, signal or state information in sectors 140 of partition 218 previously were protected by EC stored on two sectors rather than one. Now, less memory is dedicated to storage of EC-related signal or state information. Therefore, a relatively less robust EC may be used as a result.

Nonetheless, useful life for memory portion 100, for example, may have been extended. A bad sector, such as 245, might have otherwise resulted in a wider memory or device failure than section 245 alone. Furthermore, signal or state information in partitions 212, 214, or 216 may continue to be protected by EC stored across two sectors.

Figure 3:
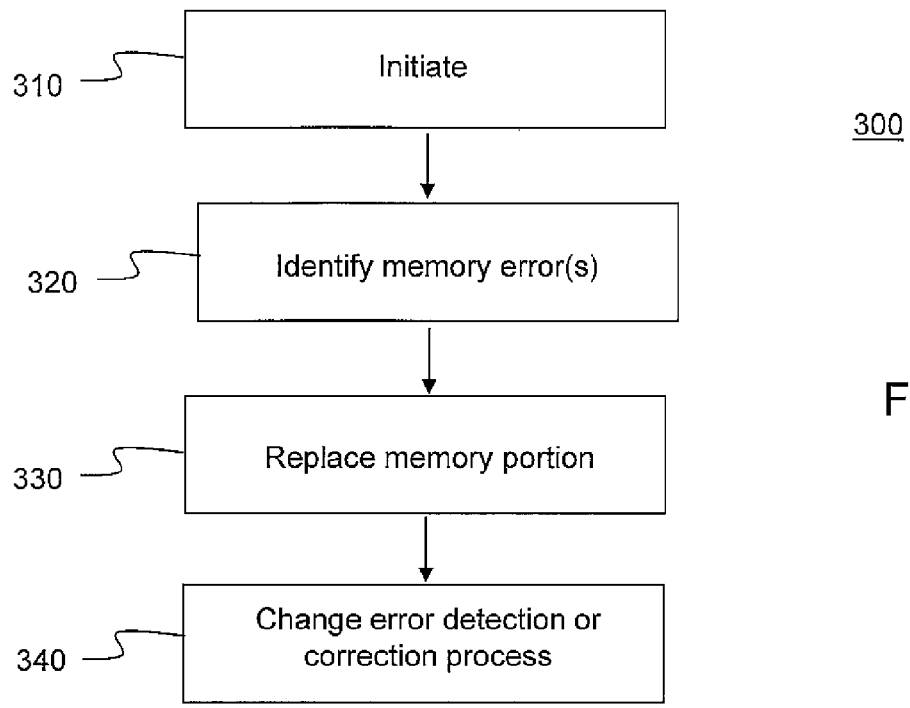
FIG. 3 includes flow diagrams of embodiments of a method of adjusting error detection and/or correction.

FIG. 3 includes a flow diagram of an embodiment of a method 300 of operating a memory. It is noted, nonetheless, that the operations illustrated may be performed in a different order and remain within the scope of claimed subject matter. A portion of memory may be similar to that shown in FIGS. 1 and 2. At block 310, a method may be initiated by a processor executing an application, for example. At block 320, in connection with read operations or write operations, for example, one or more errors may be detected and identified. Identified error(s) may be logged or recorded as corresponding to particular memory location(s) with particular memory addresse(s), such as in a portion of memory being written to or in another memory, though claimed subject matter is not so limited. For example, logged memory address location(s) of memory error(s) may be used later to correct error(s).

A determination may also be made, for example, whether one or more memory locations is at least partially non-functional. For example, if a portion of memory is determined to be at least partially non-functional, it can be retired and replaced, as in block 330. As a result, via a process of remapping, for example, subsequent write or read operations directed to a retired portion of memory may be re-directed to a replacement portion. Remapping may comprise assigning another physical memory address location for a retired physical memory location, thereby changing the logical to physical address mapping of the memory segment as seen by a system's address map. For example, a write request directed to a retired memory address location may be redirected to a memory address specifying a different location where state information is to be written. Also, information contents stored in a retired portion of memory may be transferred (e.g., copied) to a replacement portion, for example.

At block 340, an error detection and/or correction process can be adjusted (e.g., changed). For example, an error correction process may comprise using Reed-Solomon error codes. However, as a result of adaptively reducing the level of error detection and/or correction, the use of Reed-Solomon error codes may be discontinued. Instead, an error detection process, such as parity bit error codes, may be used, for example.

Figure 4:
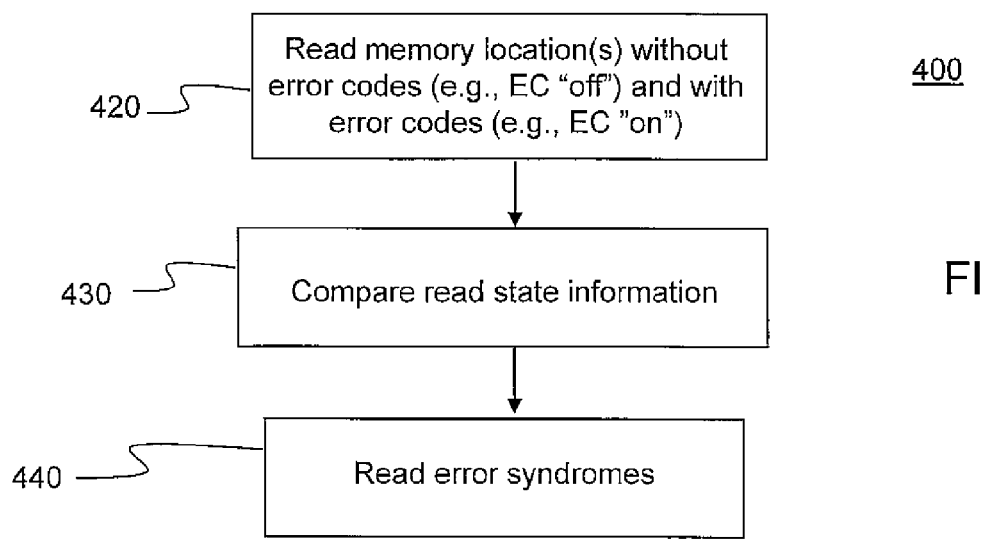
FIG. 4 is a flow diagram of an embodiment of a method to determine which portion of a memory may be non-functioning or partially functioning.

FIG. 4 is a flow diagram of an embodiment of a method 400 to determine if one or more memory locations are non-functional and, if so, determine the one or more non-functional memory locations. As indicated previously, one method for identifying a non-functional memory location may comprise comparing state information read using error codes with state information read without using error codes. A memory location that produces (e.g., provides) different state information may be non-functional. However, in some circumstances, a memory location may produce different state information, but still be functional. For example, a memory location having an error that is correctible may not necessarily be non-functional. Processes may therefore be implemented to distinguish functional and non-functional memory locations that nonetheless produce different state information. For example, error syndromes for a memory location may be examined to distinguish a functional memory location from a non-functional memory location.

At block 420, state information for a memory location may be read without using error codes (e.g., EC "off") and read using error codes (e.g., EC "on"). At block 430, a comparison of the state information read may be made. At block 440, error syndromes may be examined to distinguish a functional memory location from a non-functional memory location. Of course, details of such a memory read or write process are merely examples, and claimed subject matter is not so limited.

Figure 5:
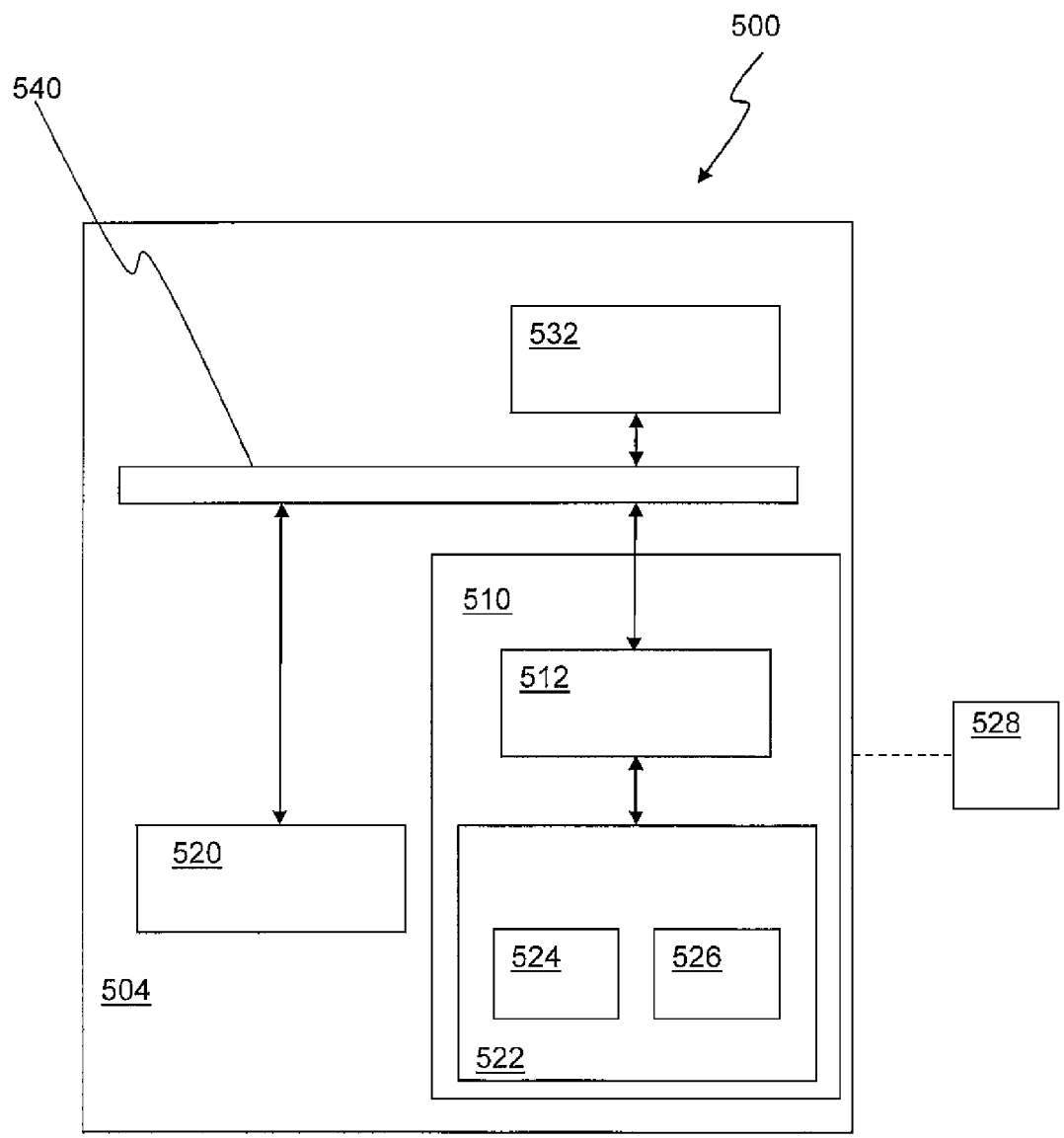
FIG. 5 is a schematic diagram illustrating an embodiment of a computing system.

FIG. 5 is a schematic diagram illustrating an embodiment of a computing system 500 including a memory device 510. A computing device may comprise one or more processors, for example, to execute an application or other code. Memory device 510 may comprise memory portion 100, shown in FIG. 1. A computing device 504 may be representative of any device, appliance, or machine that may be used to manage memory device 510. Memory device 510 may include an external memory controller (e.g., a separate physical chip or die) 512 and/or an internal memory controller (e.g., a state machine or other control circuitry on a memory chip or die 515 and a memory 522. By way of example, but not limitation, computing device 504 may include: one or more computing devices or platforms, such as, e.g., a desktop computer, a laptop computer, a workstation, a server device, or the like; one or more personal computing or communication devices or appliances, such as, e.g., a personal digital assistant, mobile communication device, or the like; a computing system or associated service provider capability, such as, e.g., a database or information storage service provider or system; or any combination thereof.

All or part of various devices shown in system 500, or processes and methods described herein, may be implemented using or otherwise including hardware, firmware, software, or any combination thereof (although this is not intended to necessarily refer to software per se). Thus, by way of example, but not limitation, computing device 504 may include at least one processing unit 520 that is operatively coupled to memory 522 via a bus 540. Processing unit 520 may comprise one or more circuits to perform at least a portion of an information computing procedure or process. By way of example but not limitation, processing unit 520 may include one or more processors, controllers, microprocessors, microcontrollers, application specific integrated circuits, digital signal processors, programmable logic devices, field programmable gate arrays, or the like, or any combination thereof. Processing unit 520 may include an operating system that if executed is capable of communicating with a memory controller, such as internal memory controller 512 and/or external memory controller 515. An operating system may, for example, generate commands to be sent to memory controller 512 and/or 515 over or via bus 540. Commands may comprise read or write commands, for example. Likewise, memory controller 512 and/or 515 may adaptively reduce error detection and/or correction for one or more portions of memory 522. Controller 512 and/or 515 may further be able to adaptively increase the number of states stored per cell in a first number of memory sectors to compensate for loss of memory capacity in at least partially non-functional sectors. In a particular implementation, computing system 500 may comprise memory 522 comprising a first number of memory sectors to store EC-related signal or state information and a second number of memory sectors to store other signal or state information.

Memory 522 is representative of any information storage mechanism. Memory 522 may include, for example, a primary memory 524 or a secondary memory 526. Primary memory 524 may include, for example, a random access memory, read only memory, etc. While illustrated in this example as being separate from processing unit 520, it should be understood that all or part of primary memory 524 may be provided within or otherwise co-located/coupled with processing unit 520.

Secondary memory 526 may include, for example, the same or similar type of memory as primary memory or one or more other types of information storage devices or systems, such as, for example, a disk drive, an optical disc drive, a tape drive, a solid state memory drive, etc. In certain implementations, secondary memory 526 may be operatively receptive of, or otherwise able to couple to, a storage medium, such as computer-readable medium 528. Computer-readable medium 528 may include, for example, any medium able to carry or make accessible signal or state information, such as code, or instructions for one or more devices, such as in system 500.

Computing device 504 may include, for example, an input/output device 532. Input/output device 532 is representative of one or more devices or features able to accept or otherwise introduce human or machine produced signal inputs, or one or more devices or features able to deliver or provide human or machine comprehendible signal outputs. By way of example, but not limitation, input/output device 532 may include a display, speaker, keyboard, mouse, trackball, touch screen, signal port, etc.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

Some portions of the preceding detailed description have been presented in terms of logic, algorithms or symbolic representations of operations on binary states stored within a memory of a specific apparatus or special purpose computing device or platform. In the context of this particular specification, the term specific apparatus or the like includes a general purpose computer once it is programmed to perform particular functions pursuant to instructions from program software. Algorithmic descriptions or symbolic representations are examples of processes used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated as electronic signals representing information. It has proven convenient at times, principally for reasons of common usage, to refer to such signals as bits, data, values, elements, symbols, characters, terms, numbers, numerals, information, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining", "establishing", "obtaining", "identifying", "selecting", "generating", or the like may refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device. In the context of this particular patent application, the term "specific apparatus" may include a general purpose computer once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and storage of charge or a release of stored charge. Likewise, in other memory devices, a change of state may comprise a physical change or transformation in magnetic orientation or a physical change or transformation in molecular structure, such as from crystalline to amorphous or vice-versa. In still other memory devices, a change in physical state may involve quantum mechanical phenomena, such as, superposition, entanglement, or the like, which may involve quantum bits (qubits), for example. The foregoing is not intended to be an exhaustive list of all examples in which a change in state for a binary one to a binary zero (or a change in state for a combination of binary ones and binary zeroes) or vice-versa in a memory device may comprise a transformation, such as a physical transformation. Rather, the foregoing are intended as illustrative examples.

It will, of course, be understood that, although particular embodiments have just been described, claimed subject matter is not limited in scope to a particular embodiment or implementation. For example, one embodiment may be in hardware, such as implemented on a device or combination of devices, for example. Likewise, although claimed subject matter is not limited in scope in this respect, one embodiment may comprise one or more articles, such as a storage medium or storage media that may have stored thereon instructions capable of being executed by a specific or special purpose system or apparatus, for example, to result in performance of an embodiment of a method in accordance with claimed subject matter, such as one of the embodiments previously described, for example. However, claimed subject matter is, of course, not limited to one of the embodiments previously described necessarily. Furthermore, a specific or special purpose computing platform may include one or more processing units or processors, one or more input/output devices, such as a display, a keyboard or a mouse, or one or more memories, such as static random access memory, dynamic random access memory, flash memory, or a hard drive, although, again, claimed subject matter is not limited in scope to this example.

In the preceding description, various aspects of claimed subject matter have been described. For purposes of explanation, specific numbers, systems, or configurations may have been set forth to provide a thorough understanding of claimed subject matter. However, it should be apparent to one skilled in the art having the benefit of this disclosure that claimed subject matter may be practiced without those specific details. In other instances, features that would be understood by one of ordinary skill were omitted or simplified so as not to obscure claimed subject matter. While certain features have been illustrated or described herein, many modifications, substitutions, changes, or equivalents may now occur to those skilled in the art. It is, therefore, to be understood that the appended claims are intended to cover all such modifications or changes as fall within the true spirit of claimed subject matter.

What is claimed is:

1. A method comprising:
   providing with an initial storage capacity;
   subsequently determining that a portion of the memory is at least partially non-functional;
   replacing the portion of at least partially non-functional memory with a portion of said memory previously allocated to error detection and/or correction, wherein replacing provides a total amount of functional memory having a storage capacity substantially equal to the initial storage capacity; and
   adjusting an error detection and/or correction process responsive to determining that the portion of the memory is at least partially non-functional and/or replacing the portion of at least partially non-functional memory.

2. The method of claim 1, wherein said replacing the portion of at least partially non-functional memory includes: transferring signal or state information from the portion of at least partially non-functional memory; and adjusting a memory map.

3. The method of claim 1, wherein determining that a portion of said memory is at least partially non-functional comprises determining the non-functional portion of said memory by detecting a difference between signal or state information read from said memory using error codes and signal or state information read from said memory without using error codes.

4. The method of claim 1, wherein adjusting the error detection and/or correction process comprises using an error code with fewer bits for selected memory locations.

5. The method of claim 1, wherein said memory comprises portions of memory arrays from multiple memory devices.

6. The method of claim 1, wherein adjusting the error detection and/or correction process comprises reducing a size of error detection and/or correction codes.

7. The method of claim 1, wherein said at least partially non-functional memory comprises non-functional memory.

8. The method of claim 1, wherein determining that said portion of a memory is at least partially non-functional comprises comparing a number of errors associated with the portion to an error threshold.

9. A method comprising:
   providing with an initial storage capacity;

subsequently adaptively reducing memory error detection and/or correction ability in response to identifying an error-prone memory location in a portion of the memory; and using an error code (EC) memory portion to store signal or state information previously stored in the identified memory location, wherein using provides a total amount of non error-prone memory locations having a storage capacity substantially equal to the initial storage capacity.

10. The method of claim 9, wherein said identifying error-prone memory location comprises:

for one or more memory locations, reading signal or state information from the memory locations with and without using error code detection and/or correction; and determining a difference in signal or state information read from a particular memory location using error code detection and/or correction and signal or state information read from the particular memory location without using error code detection and/or correction.

11. The method of claim 9, wherein said memory comprises a solid state drive (SSD).

12. The method of claim 9, further comprising determining whether a particular portion of said memory is at least partially non-functional based, at least in part, on identifying error-prone memory locations in the particular portion; and wherein using the EC memory portion comprises substituting the at least partially non-functional portion of said memory with said EC memory portion.

13. The method of claim 12, further comprising:

using said error correction and/or detection to detect and/or correct one or more memory errors.

14. A non-volatile memory device comprising:

a memory with an initial storage capacity, said memory including one or more portions allocated to store error code (EC)-related signal or state information and one or more portions allocated to store non-EC signal or state information; and a controller to remap memory locations in the one or more non-EC portions that are determined to be error prone to memory locations in the one or more EC-related portions, wherein a remapping provides a total amount of non-EC portions having a storage capacity substantially equal to the initial storage capacity, and wherein said controller is able to adjust error correction and/or detection used with said memory.

15. The non-volatile memory device of claim 14, wherein said non-volatile memory device comprises a solid state drive.

16. The non-volatile memory device of claim 14, wherein said memory device is incorporated in at least one of the following: a desktop computer, a laptop computer, a workstation, a server device, a personal digital assistant, a mobile communication device, or any combination thereof.

17. A system comprising:

memory with an initial storage capacity and including a first number of memory sectors to store error code (EC)-related signal or state information and a second number of memory sectors to store other signal or state information, said memory further including a memory controller to:

access signal or state information stored in memory locations in said second number of memory sectors;

identify one or more at least partially non-functional sectors of said second number of memory sectors; and use one or more sectors in said first number of memory sectors as a substitute for said one or more at least partially non-functional sectors, wherein a substitution provides a total amount of said second number of memory sectors having a storage capacity substantially equal to the initial storage capacity.

18. The system of claim 17, wherein said memory controller is able to remap memory locations between sectors.

19. The system of claim 18, wherein a remap of memory locations between sectors includes a transfer of stored signal or state information between memory locations.

20. The system of claim 17, and further comprising a processor coupled to said memory.

21. The system of claim 20, wherein said controller is further able to adaptively reduce the error detection and/or correction used with said memory.

22. The system of claim 17, wherein said controller is further able to adaptively increase the number of states stored per cell in said first number of memory sectors to compensate for loss of memory capacity in said at least partially non-functional sectors.

23. The system of claim 21, wherein said controller is further able to, in connection with identifying one or more at least partially non-functional sectors, read signal or state information from said memory using error codes and read signal or state information from said memory without using error codes.

24. An apparatus comprising:

a plurality of integrated circuit (IC) memory chips with an initial storage capacity; and a memory controller to:

determine that one or more memory sectors of said IC memory chips is at least partially non-functional;

adjust error correction and/or detection for one or more sectors of said IC memory chips; and replace the one or more at least partially non-functional sectors with one or more sectors allocated to error detection and/or correction, where a replacing provides a total amount of functional memory having a storage capacity substantially equal to the initial storage capacity.

25. The apparatus of claim 24, wherein, for a memory sector of said IC memory chips, said memory controller is able to determine a difference between signal or state information read from said memory sector using error correction and/or detection and signal or state information read without using error correction and/or detection.

26. The apparatus of claim 24, wherein to adjust error detection and/or correction for one or more sectors, said controller is able to apply an error code with fewer bits for the one or more sectors.

* * * * *